United States Patent [19]
Liu et al.

[11] Patent Number: 5,949,728
[45] Date of Patent: Sep. 7, 1999

[54] HIGH SPEED, NOISE IMMUNE, SINGLE ENDED SENSING SCHEME FOR NON-VOLATILE MEMORIES

[75] Inventors: Kwo-Jen Liu, San Jose; Chuck Cheuk-Wing Cheng, Saratoga, both of Calif.

[73] Assignee: Scenix Semiconductor, Inc., Santa Clara, Calif.

[21] Appl. No.: 08/989,936

[22] Filed: Dec. 12, 1997

[51] Int. Cl.$^6$ .................................................. G11C 7/00
[52] U.S. Cl. ...................... 365/206; 365/189.06; 365/210
[58] Field of Search .................................. 365/206, 207, 365/189.06, 210, 211, 185.21

[56] References Cited

U.S. PATENT DOCUMENTS

| | | | |
|---|---|---|---|
| 4,594,689 | 6/1986 | Donoghue | 365/182 |
| 4,918,341 | 4/1990 | Galbraith et al. | 365/207 |
| 5,013,943 | 5/1991 | Hirose | 307/530 |
| 5,117,394 | 5/1992 | Amin et al. | 365/203 |
| 5,386,388 | 1/1995 | Atwood et al. | 365/201 |
| 5,410,511 | 4/1995 | Michiyama | 365/218 |
| 5,477,499 | 12/1995 | Van Buskirk et al. | 365/218 |
| 5,521,875 | 5/1996 | Callahan | 365/207 |
| 5,559,737 | 9/1996 | Tanaka et al. | 365/185.25 |
| 5,563,843 | 10/1996 | Fackenthal et al. | 365/233.5 |
| 5,608,675 | 3/1997 | Nam | 365/207 |
| 5,625,588 | 4/1997 | Seyyedy et al. | 365/207 |

*Primary Examiner*—Tan T. Nguyen
*Attorney, Agent, or Firm*—Fenwick & West LLP

[57] ABSTRACT

A single ended sensing scheme amplifies the logic state stored within a non-volatile memory circuit by relying upon three stages, a clamping circuit, a first operational amplifier and a second operational amplifier. The clamping circuit clamps the voltage at a voltage level with a small voltage swing between the logic states. The first stage and second stage operational amplifiers increase the clamped voltage level. A reference memory circuit ensures that the sensing scheme output is properly adjusted to compensate for voltage and temperature variations as well as noise injection from the power supply and ground.

20 Claims, 3 Drawing Sheets

ND SPEED, NOISE IMMUNE, SINGLE
ENDED SENSING SCHEME FOR NON-
VOLATILE MEMORIES

HIGH SPEED, NOISE IMMUNE, SINGLE ENDED SENSING SCHEME FOR NON-VOLATILE MEMORIES

RELATED APPLICATION

The subject matter of this application is related to the subject matter of application Ser. No. 08/989,846, entitled "High Voltage NMOS Switch Design," applicant reference number 3136, filed concurrently herewith by Kwo-Jen Liu and Chuck Cheuk-Wing Cheng and having the same assignee as the present invention and is incorporated herein by reference in its entirety.

BACKGROUND OF THE INVENTION

1. Field of the Invention

The present invention generally relates to memory devices, and more particularly, to a single ended sensing scheme for use in determining the data stored in memory cells of non-volatile memory circuits.

2. Description of Background of Art

An electrically erasable programmable read only memory ("EEPROM") is a non-volatile integrated memory circuit, which stores data in an array of memory cells formed on a silicon substrate and constructed from enhancement-type n-channel metal-oxide semiconductor field effect ("NMOS") transistors. Each memory cell consists of two NMOS transistors, a "select" transistor $M_s$ and a "memory" transistor $M_m$, which are jointly organized into a memory array of aligned rows representing word lines and aligned columns representing bit lines. The word lines and bit lines are activated by a row decoder and a column decoder, respectively.

Typically, during the programming operation for the memory cell, a high voltage $V_{pp}$ of about 12 to 20 volts is transferred by the row decoder to the selected word line to turn "on" the select transistor of the selected memory cell. By the column decoder further transferring $V_{pp}$ to the selected bit line attached to the drain electrode of the select transistor, the memory transistor is placed in the "0" logic state with a threshold voltage ranging from approximately 0.8V to −2 volts.

During the erasure operation, the control gate of the selected memory cell is raised to a high voltage $V_{pp}$ and the bit line of the selected memory cell is lowered to 0 volts. Since the floating gate is electrically isolated from the memory transistor, once the high voltage $V_{pp}$ is removed, a charge remains on the floating gate and the threshold voltage of the memory transistor is raised to at least half of the overall power supply voltage $V_{cc}$, which is approximately 1.5 to 6 volts. To detect whether the memory cell has been programmed or erased, a single ended sensing scheme is electrically coupled to each memory cell bit line. During the read mode, a read voltage of approximately $V_{cc}/2$ is applied to the control gate of the memory transistor $M_m$. This read voltage generally is greater than the threshold voltage of the memory transistor at the "0" logic state and less than the threshold voltage of the memory transistor at the "1" logic state. A ground control transistor $M_{gc}$ will pull the common source of the memory cells to ground.

When the read voltage is applied to the memory cell containing the programmed "0" logic state, that memory cell will lower the bit line voltage level. Alternatively, when a read voltage is applied to the memory cells containing the erased "1" logic state, the memory cell will not conduct because of a higher control gate threshold voltage and the input lead of the single ended sensing scheme will slightly increase the bit line voltage level. The single ended sensing scheme will then transform the corresponding logic state voltages into amplified output voltage $V_{out}$ levels.

Because memory products require a high density of memory cells to store as much data as possible, multiple memory cells in the same memory array are electrically coupled to the same bit line. This multiple usage of bit lines, however, results in the bit lines possessing a large loading capacitance, which increases the bit line voltage swing time between the low and the high voltage states. The relationship between the swing time and the swing voltage can be mathematically described by the following equation:

$$T = C_{bit} V_{bit} / I_{cell}$$

where T is the time for the bit line to swing between the "0" and the "1" logic states; $C_{bit}$ is the bit line capacitance; $V_{bit}$ is the voltage swing of the bit line; and $I_{cell}$ is the current sinking into the memory cell. To reduce the time required to propagate data from a specific memory cell to the outside CMOS circuitry, a smaller voltage swing on the bit line is necessary. Unfortunately, in a high speed circuit environment the single ended sensing scheme with the small voltage swing is susceptible to bit line noise problems and voltage variations, which results in the generation of false data.

What is needed is a single input sensing scheme, which is more noise immune at high speeds, thereby enabling the sensing scheme to maintain optimal performance speeds and generate accurate data.

SUMMARY OF THE INVENTION

Accordingly, the present invention utilizes a three stage single ended sensing scheme to reliably amplify, within a short period of time, a small memory array bit line voltage, which is substantially immune from noise, and is substantially independent from temperature, wafer process, and power supply voltage variations. This single ended sensing scheme includes a clamping circuit, a first operational amplifier and a second operational amplifier.

The clamping circuit receives the memory cell bit line voltage and clamps the voltage at a voltage level with a small voltage swing between the "0" and "1" logic state voltages. By self-adjusting the memory cell process variation, a reference memory circuit is electrically coupled to the clamping circuit to increase ground and power supply noise immunity as well as to ensure proper tracking of the memory cell threshold voltage and current characteristics.

The first stage operational amplifier increases the clamp voltage level by a gain of 100. The second stage operational amplifier both buffers the output of the first stage operational amplifier by increasing the voltage swing of the clamped voltage level and lowers the output resistance.

To reduce power dissipation when the sensing scheme is not needed, after an output latch latches the output voltage signal from the second stage operational amplifier and provides the voltage signal to attached circuitry, the sensing scheme is powered down. While the sensing scheme is powered down, the output latch stores the output voltage signal, which is accessed by external circuitry.

DETAILED DESCRIPTION OF THE PREFERRED EMBODIMENTS

An embodiment of the present invention is now described with reference to the figures where like reference numbers indicate identical or functionally similar devices. Also in the figures, the left most digit of each reference number correspond to the figure in which the reference number is first used.

Figure 1:
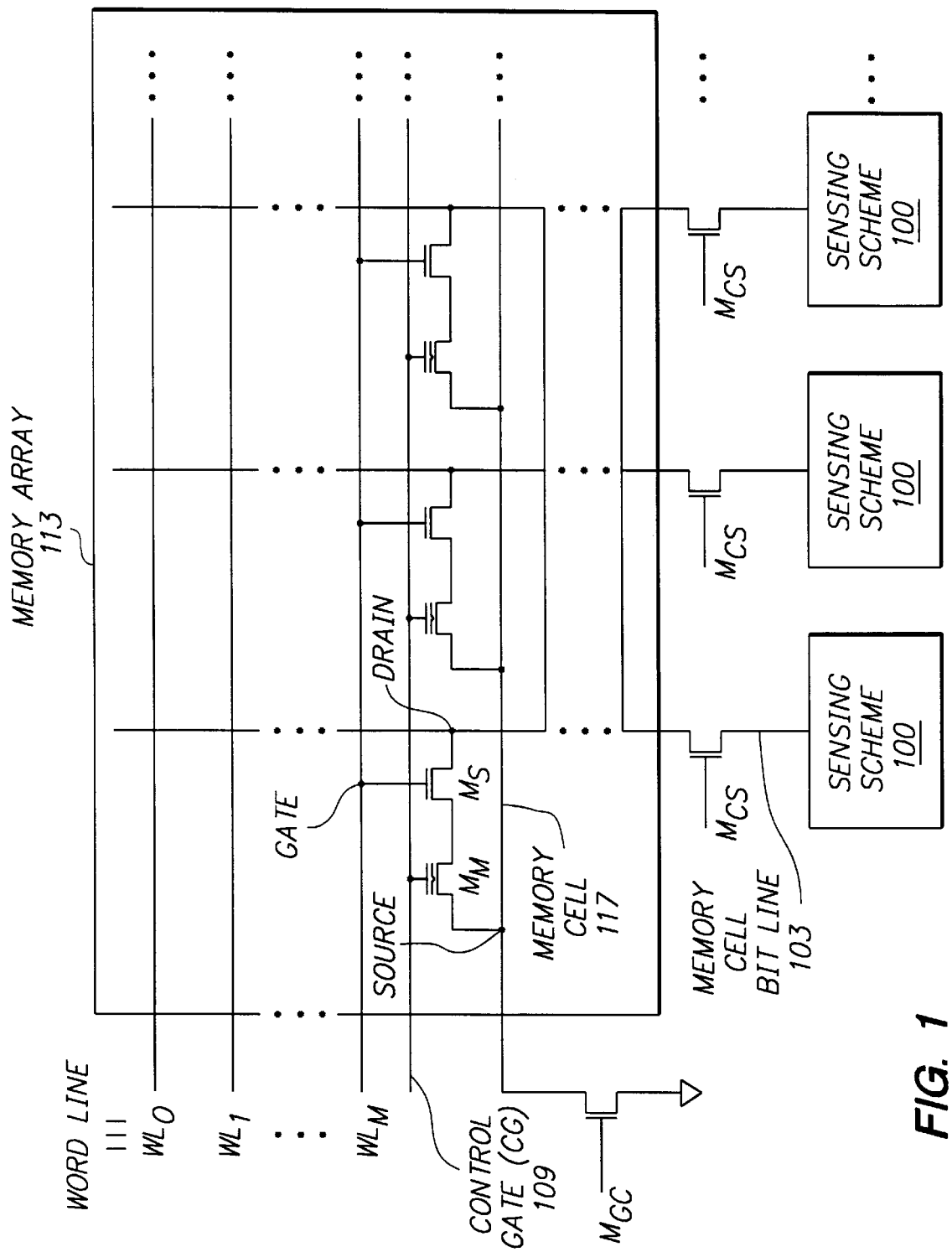
FIG. 1 illustrates an EEPROM memory array connected to an embodiment of a single ended sensing scheme

FIG. 1 is an overview of an embodiment of a single ended sensing scheme 100, which is electrically coupled to an EEPROM memory array 113, for verifying the logic state of the memory cells 117 within the memory array 113. Since construction of such memory arrays is well known to those of ordinary skill in the art, for simplicity, the entire array of memory cells is not shown.

The memory cells 117, which are organized into rows called word lines 111 and into columns called memory cell bit lines 103, each include a memory transistor $M_m$ and a select transistor $M_s$. Each memory cell bit line 103 is electrically coupled between a drain electrode of a select transistor $M_s$ and a source electrode of a column select transistor $M_{cs}$. The bit line 103 also is electrically coupled between a drain electrode of the column select transistor $M_{cs}$ and an input of the single ended sensing scheme 100. The word line is electrically coupled to a gate electrode of the select transistor $M_s$.

As previously discussed, when a memory cell 117 is selected for programming, the memory transistor $M_m$ is placed into a "0" logic state by lowering the threshold voltage $V_{tmm}$ to a range of approximately 0.8V to -2V. When the corresponding word line 111 and bit line 103 for the memory cell 117 are activated to erase a memory cell 117, the memory transistor $M_m$, threshold voltage $V_{tmm}$ is raised to over approximately 1/2 $V_{cc}$.

For the sensing scheme 100 to detect whether a memory cell 117 is storing a "1" or a "0" logic state value, a specific word line and bit line, corresponding to the desired memory cell 117, are selected by the user and a read voltage $V_{cc}/2$ m is applied to the control electrode of the memory transistor $M_m$ and a voltage of approximately 1.5 volts is applied to the drain electrode of the select transistor $M_s$. If the selected memory cell contains a "0" logic state value, the memory cell will lower the memory cell bit line 103 voltage level. Alternatively, a memory cell with a "1" logic state value will not conduct, thereby leaving the memory cell bit line 103 at a higher voltage level.

Figure 2:
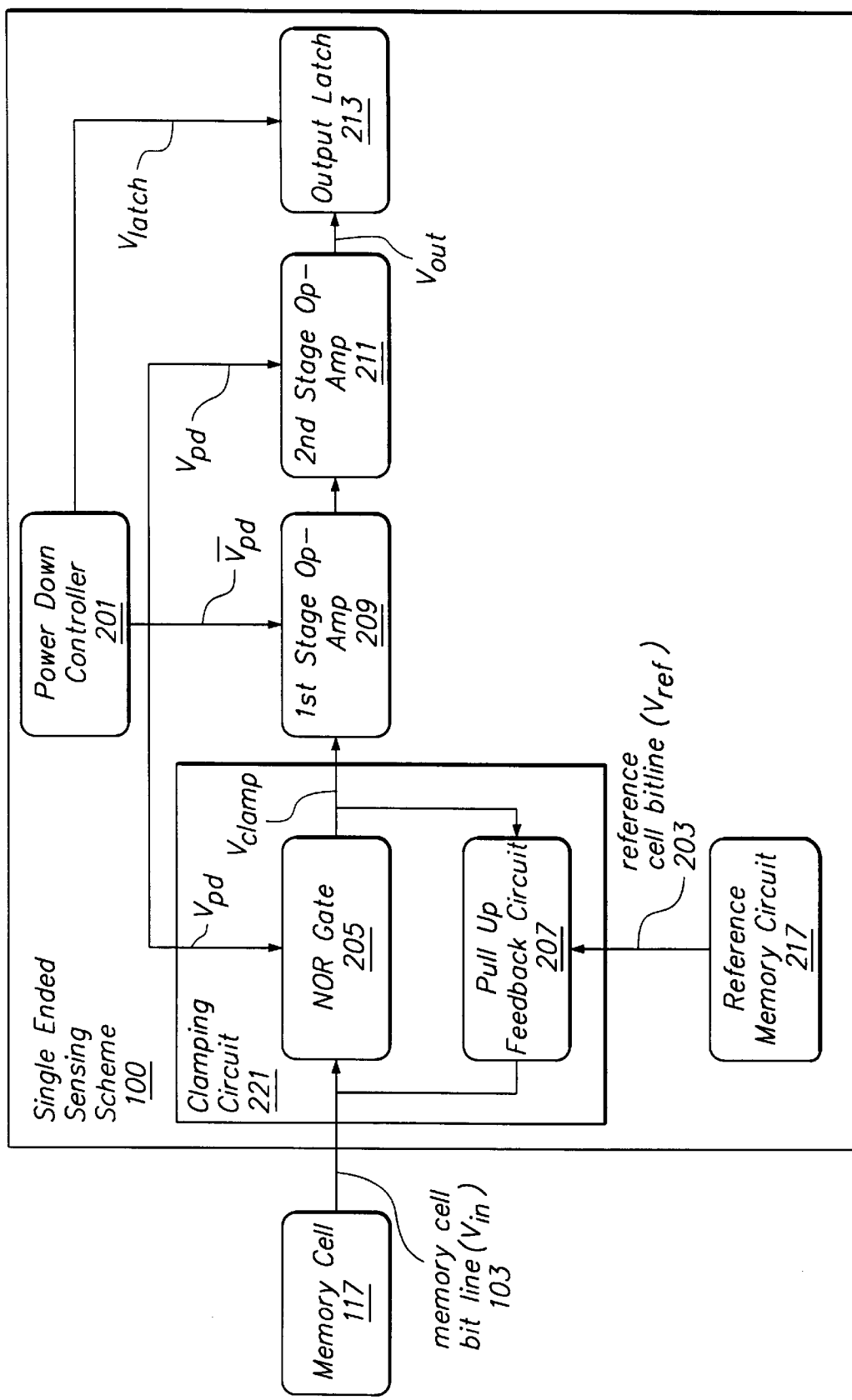
FIG. 2 is a high level illustration describing the embodiment of the single ended sensing scheme.
Figure 3:
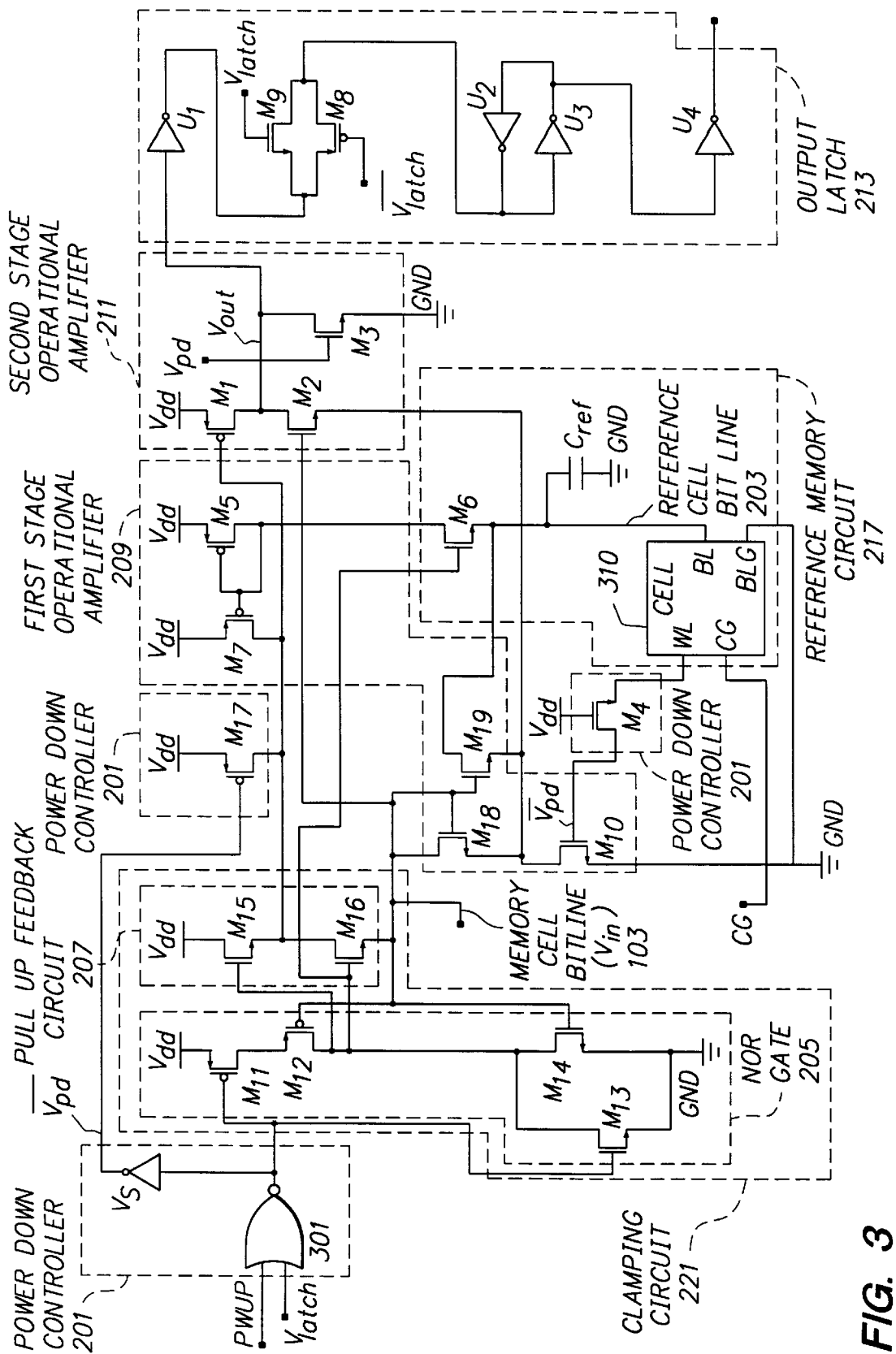
FIG. 3 is an illustration of a schematic that describes in more detail the embodiment of the single ended sensing scheme.

The single ended sensing scheme 100 amplifies either the "0" or "1" logic state voltage level of the selected memory cell by amplifying the memory bit line voltage $V_{in}$ to a higher voltage level. These amplified voltage levels ensure that external logic circuitry, which is not shown in the illustration, can more quickly and accurately process data stored within the EEPROM. FIG. 2 and 3 will discuss these aspects of the single ended sensing scheme in more detail.

FIG. 2 is a high level drawing of a detailed view of the single ended sensing scheme 100. The single ended sensing scheme 100 includes a clamping circuit 221, a first stage operational amplifier 209, a second stage operational amplifier 211, an output latch 213, a reference circuit 217, and a power down controller 201.

When the sensing scheme 100 is powered on, the clamping circuit 221 receives a memory cell bit line voltage $V_{in}$ from the memory cell 117. To ensure a high gain of the $V_{in}$ and a faster switching time between the logic states, the clamping circuit pulls up and clamps $V_{in}$ at a clamped voltage level $V_{clamp}$ of approximately 1.5 volts with a voltage swing range of approximately 10 millivolts to 30 millivolts.

The clamping circuit 221, which as previously discussed pulls up and clamps $V_{in}$, includes a two input NOR gate 205 and a pull up feedback circuit 207. The first input node of the NOR gate 205 receives the memory cell bit line voltage $V_{in}$. The second input node of the NOR gate receives the power down control signal $V_{pd}$. The output of the NOR gate 205 $V_{clamp}$ is electrically coupled to the input node of the first stage operational amplifier 209. The pull up feedback circuit 207 is electrically coupled between the output of the NOR gate and the first input of the NOR gate. When the sensing scheme 100 first receives the memory cell bit line voltage $V_{in}$, the pull up feedback circuit 207 serves as a feedback loop for the NOR gate 205 to ensure that the clamping circuit 221 clamps the bit line voltage $V_{in}$ at $V_{clamp}$, which is approximately 1.5 volts with an approximate 10 millivolts to 30 millivolts voltage swing. The clamping circuit 221 will be discussed in further detail in FIG. 3.

To ensure that the clamping circuit 221 maintains the proper clamped memory bit line voltage level $V_{clamp}$, a reference memory circuit 217 is electrically coupled to the pull up feedback circuit 207 to provide a reference saturation current source to the sensing scheme input. The reference memory circuit 217 then is able to track and self-adjust variations in the memory cell threshold voltage and memory cell current characteristics, thereby ensuring an increased immunity to ground and power supply noise. The reference memory circuit 217 will be discussed in further detail in FIG. 3.

Once the memory cell bit line voltage $V_{in}$ is properly clamped to $V_{clamp}$ with the corresponding small voltage swing, the first stage operational amplifier 209 amplifies $V_{clamp}$ by a gain of approximately 100. The second stage operational amplifier 211, which receives the amplified $V_{clamp}$, further amplifies $V_{clamp}$ by an additional gain of approximately 1–5 as well as lowers the output resistance of the sensing scheme 100. The first stage operational amplifier 209 and second stage operational amplifiers 211 will be discussed in further detail in FIG. 3.

Prior to powering down the sensing scheme 100 in order to maintain a low power dissipation for the sensing scheme 100, a latching signal $V_{latch}$ is transmitted by the power down controller 201 to the output latch 213 resulting in the output latch 213 storing the current output voltage signal $V_{out}$ of the second operational amplifier. Once $V_{out}$ is latched, the power down controller 201 transmits a power down signal $V_{pd}$ to the remaining components of the sensing scheme 100 to initiate the power down sequence. The output latch 213 will be discussed in further detail in FIG. 3.

FIG. 3 is a detailed schematic drawing of the single ended sensing scheme 100. The single ended sensing scheme 100 includes twenty transistors $M_1$–$M_{19}$, a reference capacitor $C_{ref}$, a power down controller NOR gate 301, and five inverters $U_1$–$U_5$. The power down controller 201 includes the power down controller NOR gate 301, the inverter $U_5$, $M_{19}$ and $M_4$.

To power down the single ended sensing scheme 100, the power down controller NOR gate 301 transmits a high state signal $V_{pd}$ to the first input of the clamping circuit NOR gate 205 and a low state signal to transistors $M_4$, $M_{10}$, and $M_{17}$. The high state signal $V_{pd}$ transmitted to the first input of the clamping circuit NOR gate 205 in conjunction with the high state signal of $V_{in}$ will result in transistors $M_{13}$ turning on and transistor $M_{11}$ turning off, thereby grounding $V_{clamp}$ at 0V and powering down the clamping circuit 221. The low state voltage (inverted $V_{pd}$ signal) received by $M_{10}$ and $M_4$ powers down the first stage operational amplifier 209. The low state voltage received by $M_{17}$ and the high state voltage $V_{pd}$ received by $M_3$ powers down the second stage operational amplifier 211.

To power on the single ended sensing scheme 100, the power down control NOR gate 301 transmits a low state signal to the first input of the clamping circuit NOR gate 205, which thereby turns on the clamping circuit 221. Once the clamping circuit 221 is turned on, the memory cell bit line voltage $V_{in}$ is clamped at $V_{clamp}$ by the pull up feedback circuit 207.

The pull up feedback circuit 207 includes two NMOS transistors $M_{15}$ and $M_{16}$ and one PMOS transistor $M_7$. The control gates of $M_{15}$ and $M_{16}$, which are electrically coupled to the output of the drain electrodes of $M_{14}$ and $M_{12}$ in NOR gate 205, represent the input of the pull up feedback circuit 207. The drain electrode of PMOS transistor $M_7$ is electrically coupled to the source electrode of $M_{15}$ and the drain electrode of $M_{16}$. When the pull up feedback circuit 207 first receives the memory cell bit line voltage $V_{in}$, the transistors $M_{15}$, $M_{16}$ and $M_7$ jointly clamp the memory bit line voltage $V_{in}$ at $V_{clamp}$ of approximately 1.5 volts with approximately a 10 millivolt to 30 millivolt swing.

The reason why the voltage swing is only approximately 10 millivolts to 30 millivolts can best be explained by illustration. For example, if the voltage swing of $V_{clamp}$ is approximately 20 millivolts, the "1" logic state would be represented by 1.51 volts and the "0" logic state would be represented by 1.49 volts. The switch time between the "0" and "1" logic states, therefore, can be mathematically expressed by the following equation:

$$\Delta T = C_{bit} * \Delta V_{bit} / I_{cell}$$

where $\Delta T$ is the switch time, $C_{bit}$ is the memory cell bit line capacitance, which ranges from 1–3 pF, $\Delta V_{bit}$ is the voltage swing of the bit line and $I_{cell}$ is the current sinking into the memory cell 117. As can be seen from this equation, as $\Delta V_{bit}$ decreases, the $\Delta T$ between the high and low voltage states decreases. With $\Delta V_{bit}$ is at approximately 20 millivolts, the switching time $\Delta T$ between the "0" logic state and the "1" logic state is only approximately 0.2 nsec if $I_{cell}$ is equal to 200 uA and $C_{bit}$ is equal 200 pF.

To ensure the accuracy between the logic state and the corresponding $V_{clamp}$, the reference circuit 217 is used to the properly track the threshold voltage and the current characteristics of the memory cell 117. To compensate for noise and voltage variations, the reference circuit 217 provides a reference saturation current source which controls the voltage level of the pull up feedback circuit 207. The reference circuit 217 includes a reference bit line 203, a reference load transistor, a reference load capacitor $C_{ref}$, a trimmable reference pull-up PMOS transistor $M_5$ and a single reference memory cell 310.

The reference cell 310 ensures that the output of the sensing scheme $V_{out}$ remains independent of the process and temperature variations of the memory cell bit line voltage $V_{in}$. Like the memory cell 117, the reference memory cell 310 has the same voltage bias conditions to ensure that the reference memory cell 310 can be similarly electrically erased and programmed under the same voltage conditions.

For example, if the programmed memory cell has the high cell current from the process, the reference cell 310 with the matched current provides a lower gate voltage to the pull up PMOS transistor $M_7$. This lower gate voltage increases the PMOS pull-up current resulting in the maintaining of the memory bit line voltage $V_{in}$ level at 1.5 volts. Such tracking prevents the generation of false data output by the sensing scheme 100.

To avoid additional false data output, the reference memory cell 310 also is powered down at the same as the memory cell 117. When the sensing scheme 100 enters the next power up cycle, the corresponding memory cell bit line 103 and reference bit line 203 will both power on with the same initial conditions.

The reference capacitor $C_{ref}$ and reference transistor $M_6$ are electrically coupled to the reference bit line 203 in order to ensure that the reference bit line 203 has the same loading capacitance and resistance as the memory cell bit line 103. With the same loading, the reference bit line 203 will react in the same way as the memory cell bit line 103 under similar temperature or noise conditions, thereby further ensuring that the sensing scheme remains in phase with the memory cell bit line 103 and no false data will be generated by the sensing scheme 100.

This reliance upon the reference memory circuit 217 ensures that the single ended sensing scheme 100 maintains proper temperature and process tracking to ensure correct data amplification. The result of the reference memory circuit 217 is that the reference gate input to the pull up transistor $M_7$ self-adjusts the memory cell process variation and increases the ground and power supply noise immunity.

The first stage operational amplifier 209 includes transistors $M_5$, $M_7$, $M_{10}$, $M_{18}$, and $M_{19}$. The $V_{clamp}$ is received at the input of the first stage operation amplifier 209, which is comprised of the drain electrode of $M_{18}$ and the control gate electrodes of both $M_{18}$ and $M_{19}$. The first stage operational amplifier 209 then utilizes PMOS transistor $M_7$ as the current source for the NMOS current mirroring with positive feedback in order to increase $V_{clamp}$ by a gain of more than approximately 100.

The second stage operational amplifier 211 includes PMOS transistor $M_1$ and NMOS transistor $M_2$. The amplified $V_{clamp}$ signal is received by the control gates of $M_1$ and $M_2$ and then amplified by a gain of greater than approximately 1. If the power source $V_{cc}$ is 5 volts, the corresponding amplified output swing of the second stage operational amplifier 211 will be approximately 0.2 to $V_{cc}$–0.2V. Even if the "1" and the "0" logic state voltage levels for $V_{out}$ become asymmetrical, the size of the PMOS pull up transistor $M_7$ can be adjusted in order to compensate and maintain to proper voltage levels.

After sensing scheme 100 has been powered on for a duration of 20–100 ns, the output latch 213, which includes PMOS transistor $M_8$, NMOS transistor $M_9$ and inverters $U_1$, $U_2$, $U_3$ and $U_4$, receives $V_{out}$ from the output of the second stage operational amplifier 211. The trip point threshold voltage level of the inverters for toggling $V_{out}$ is set at the middle voltage of $V_{out}$. Once $V_{out}$ is latched by the output latch 213, the sensing scheme is turned off in order to maintain low power dissipation. Inverters $U_2$ and $U_3$, which are electrically coupled to a power supply that is not shown in the figure, then continuously maintains the latched data $V_{out}$, which external circuitry can access.

While the above description contains many specificities, these should not be construed as limitations on the scope of the invention, but rather as an exemplification of several embodiments thereof Many other variations are possible. It will be understood by those skilled in the art that various changes and modifications may be made, and equivalents may be substituted for elements thereof without departing from the true scope of the invention. Accordingly, the scope of the invention should be determined not by the embodiments illustrated, but by the appended claims and their legal equivalents.

What is claimed is:

1. A system for sensing a signal stored within a storage device, the system comprising:

a clamping circuit, disposed to receive said signal, for clamping the signal at a first voltage level when said signal corresponds to a first logic state and for clamping the signal at a second voltage level when said signal corresponds to a second logic state; and a reference circuit, coupled to the clamping circuit, for reducing voltage variations in the first voltage level and the second voltage level by substantially immunizing the clamping circuit from electrical noise.

2. The system of claim 1 further comprising:

a first amplifying device, coupled to the clamping circuit, for amplifying the signal by a first value.

3. The system of claim 2, further comprising:

a second amplifying device, coupled to the clamping circuit, for amplifying the signal by a second value and for maintaining a low output resistance.

4. The system of claim 1, further comprising:

a latching device coupled to the clamping circuit for latching the signal.

5. The system of claim 1 further comprising:

a logic device coupled to the clamping circuit for powering down the clamping circuit to maintain a low power dissipation.

6. The system of claim 1 further comprising:

a latching device coupled to the clamping circuit for latching the signal; and a logic device coupled to the clamping circuit for powering down the clamping circuit and coupled to the latching device for triggering the latching of the signal.

7. The system of claim 1 further comprising:

a first amplifying device, coupled to the clamping circuit, for amplifying the signal by a first value;

a latching device coupled to the first amplifying device for latching the signal; and a logic device coupled to the first amplifying device and the clamping circuit for powering down the first amplifying device and the clamping circuit and coupled to the latching device for triggering the latching of the signal.

8. The system of claim 1 further comprising:

a first amplifying device, coupled to the clamping circuit for amplifying the signal by a first value;

a second amplifying device, coupled to the first amplifying device, for amplifying the signal by a second value and for maintaining a low output resistance;

a latching device coupled to the second amplifying device for latching the signal; and a logic device coupled to the first amplifying device, the second amplifying device, and the clamping circuit for powering down the first amplifying device, the second amplifying device, and the clamping circuit and coupled to the latching device for triggering the latching of the signal.

9. The system of claim 1 further comprising:

a first amplifying device, coupled to the clamping circuit, for amplifying the signal by a first value; and a second amplifying device, coupled to the first amplifying device, for amplifying the signal by a second value and for maintaining a low output resistance.

10. The system of claim 1 wherein the reference circuit comprises:

a reference memory cell, coupled to the clamping circuit, for adjusting voltage and current characteristics of the clamping circuit to match voltage and current characteristics of the storage device to substantially immunize the clamping circuit from electrical noise.

11. A method for sensing a signal stored within a storage device having voltage and current characteristics, the method comprising the steps of:

triggering a clamping circuit to clamp the signal at a first voltage level when the first signal corresponds to a second logic state;

triggering a clamping circuit, to clamp the signal at a second voltage level when the first signal corresponds to a first logic state; and reducing voltage variations of the first voltage level and the second voltage level by substantially immunizing the clamping circuit from electrical noise.

12. A method of claim 11 further comprising the step of amplifying the signal by a first value.

13. A method of claim 11 further comprising the step of amplifying the signal by a second value to maintain a low output resistance.

14. A method of claim 11 further comprising the step of latching the signal.

15. A method of claim 11 further comprising the step of powering down a clamping circuit to maintain a low power dissipation.

16. A method of claim 11 further comprising the step of:

latching the signal; and powering down a clamping circuit to maintain a low power dissipation.

17. A method of claim 11 further comprising the steps of:

amplifying the signal;

latching the signal; and powering down a first amplifying device and a clamping circuit to maintain a low power dissipation.

18. A method of claim 11 further comprising the steps of:

amplifying the signal by a first value;

amplifying the signal by a second value;

maintaining a low output resistance;

latching the signal; and powering down a first amplifying device, a second amplifying device and a clamping circuit to maintain a low power dissipation.

19. A method of claim 11 further comprising the steps of:

amplifying the signal by a first value;

amplifying the signal by a second value; and maintaining a low output resistance.

20. A method of claim 11 wherein the step of reducing voltage variations further comprises the step of adjusting voltage and current characteristics of the clamping circuit to match voltage and current characteristics of the storage device.

* * * * *